(12) United States Patent
Chen et al.

(10) Patent No.: US 11,164,832 B2
(45) Date of Patent: Nov. 2, 2021

(54) PACKAGE WITH UBM AND METHODS OF FORMING

(71) Applicant: Taiwan Semiconductor Manufacturing Co., Ltd., Hsinchu (TW)

(72) Inventors: Hsien-Wei Chen, Hsinchu (TW); Li-Hsien Huang, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 16/914,931

(22) Filed: Jun. 29, 2020

(65) Prior Publication Data

US 2020/0328171 A1 Oct. 15, 2020

Related U.S. Application Data

(60) Continuation of application No. 16/207,832, filed on Dec. 3, 2018, now Pat. No. 10,700,026, which is a (Continued)

(51) Int. Cl.
*H01L 23/00* (2006.01)
*H01L 23/31* (2006.01)
*H01L 21/56* (2006.01)

(52) U.S. Cl.
CPC .......... *H01L 24/05* (2013.01); *H01L 23/3142* (2013.01); *H01L 24/03* (2013.01);
(Continued)

(58) Field of Classification Search
CPC ....... H01L 2924/00; H01L 2224/73265; H01L 2224/48227; H01L 2224/73204; H01L 2224/0231; H01L 2224/0239
See application file for complete search history.

(56) References Cited

U.S. PATENT DOCUMENTS 6,489,229 B1 12/2002 Sheridan et al.
7,465,654 B2 12/2008 Chou et al.
(Continued)

FOREIGN PATENT DOCUMENTS

CN 102130101 A 7/2011
CN 102376638 A 3/2012
(Continued)

*Primary Examiner* — Marcos D. Pizarro
*Assistant Examiner* — Quinton A Brasfield
(74) *Attorney, Agent, or Firm* — Slater Matsil, LLP

(57) ABSTRACT

Package structures and methods of forming package structures are discussed. A package structure, in accordance with some embodiments, includes an integrated circuit die, an encapsulant at least laterally encapsulating the integrated circuit die, a redistribution structure on the integrated circuit die and the encapsulant, a connector support metallization coupled to the redistribution structure, a dummy pattern, a second dielectric layer, and an external connector on the connector support metallization. The redistribution structure comprises a first dielectric layer having a first surface disposed distally from the encapsulant and the integrated circuit die. The dummy pattern is on the first surface of the first dielectric layer and around the connector support metallization. The second dielectric layer is on the first surface of the first dielectric layer and on at least a portion of the dummy pattern. The second dielectric layer does not contact the connector support metallization.

20 Claims, 14 Drawing Sheets

Related U.S. Application Data division of application No. 14/671,477, filed on Mar. 27, 2015, now Pat. No. 10,147,692, which is a continuation-in-part of application No. 14/605,848, filed on Jan. 26, 2015, now Pat. No. 10,269,752.

(60) Provisional application No. 62/050,550, filed on Sep. 15, 2014.

(52) U.S. Cl.
CPC ............. *H01L 24/11* (2013.01); *H01L 24/13* (2013.01); *H01L 24/19* (2013.01); *H01L 24/20* (2013.01); *H01L 24/97* (2013.01); *H01L 21/568* (2013.01); *H01L 23/3128* (2013.01); *H01L 2224/0233* (2013.01); *H01L 2224/0391* (2013.01); *H01L 2224/03462* (2013.01); *H01L 2224/03464* (2013.01); *H01L 2224/03472* (2013.01); *H01L 2224/03828* (2013.01); *H01L 2224/0401* (2013.01); *H01L 2224/04105* (2013.01); *H01L 2224/05024* (2013.01); *H01L 2224/05552* (2013.01); *H01L 2224/05556* (2013.01); *H01L 2224/05567* (2013.01); *H01L 2224/05572* (2013.01); *H01L 2224/05624* (2013.01); *H01L 2224/05647* (2013.01); *H01L 2224/05666* (2013.01); *H01L 2224/05684* (2013.01); *H01L 2224/11334* (2013.01); *H01L 2224/12105* (2013.01); *H01L 2224/131* (2013.01); *H01L 2224/13007* (2013.01); *H01L 2224/13021* (2013.01); *H01L 2224/13022* (2013.01); *H01L 2224/13023* (2013.01); *H01L 2924/14* (2013.01)

(56) References Cited

U.S. PATENT DOCUMENTS

| | | | |
|---|---|---|---|
| 7,960,269 B2 | 6/2011 | Lo et al. | |
| 7,977,783 B1 | 7/2011 | Park et al. | |
| 7,989,954 B2 * | 8/2011 | Lin | H01L 21/76873 257/758 |
| 8,598,715 B2 | 12/2013 | Chen | |
| 8,884,433 B2 | 11/2014 | Lin et al. | |
| 8,912,087 B2 | 12/2014 | Hirtreiter et al. | |
| 8,916,972 B2 | 12/2014 | Lin et al. | |
| 9,196,587 B2 | 11/2015 | Ying et al. | |
| 2003/0027430 A1 | 2/2003 | Stevens | |
| 2003/0166332 A1 | 9/2003 | Tong et al. | |
| 2004/0182915 A1 | 9/2004 | Bachman et al. | |
| 2005/0040527 A1 | 2/2005 | Huang | |
| 2007/0069346 A1 | 3/2007 | Lin et al. | |
| 2007/0164279 A1 * | 7/2007 | Lin | H01L 24/05 257/48 |
| 2007/0205520 A1 | 9/2007 | Chou et al. | |
| 2008/0042275 A1 | 2/2008 | Kuan et al. | |
| 2008/0174003 A1 | 7/2008 | Monthei et al. | |
| 2009/0096098 A1 | 4/2009 | Yang et al. | |
| 2010/0072635 A1 | 3/2010 | Kuo et al. | |
| 2011/0068468 A1 | 3/2011 | Lin et al. | |
| 2011/0186987 A1 | 8/2011 | Wang et al. | |
| 2011/0198748 A1 | 8/2011 | Koike | |
| 2011/0241202 A1 * | 10/2011 | Liu | H01L 23/562 257/737 |
| 2012/0040524 A1 | 2/2012 | Kuo et al. | |
| 2012/0133032 A1 * | 5/2012 | Tsai | H01L 21/561 257/659 |
| 2014/0035127 A1 | 8/2012 | Hirtreiter et al. | |
| 2012/0299176 A9 | 11/2012 | Lin et al. | |
| 2013/0026618 A1 * | 1/2013 | Chen | H01L 23/5329 257/737 |
| 2013/0087916 A1 * | 4/2013 | Lin | H01L 24/05 257/738 |
| 2013/0140689 A1 | 6/2013 | Chen | |
| 2014/0051244 A1 | 2/2014 | Kuo et al. | |
| 2014/0210080 A1 | 7/2014 | Chang et al. | |
| 2014/0231125 A1 | 8/2014 | Chen et al. | |
| 2015/0279793 A1 | 10/2015 | Kuo et al. | |
| 2016/0079190 A1 | 3/2016 | Yu et al. | |
| 2016/0133807 A1 | 5/2016 | Hwang | |

FOREIGN PATENT DOCUMENTS

| | | |
|---|---|---|
| CN | 103137582 A | 6/2013 |
| CN | 105428329 A | 3/2016 |
| JP | 08181423 A | 7/1996 |
| TW | 200847352 A | 12/2008 |
| TW | 200917441 A | 4/2009 |
| TW | 201431036 A | 8/2014 |

* cited by examiner

PACKAGE WITH UBM AND METHODS OF FORMING

PRIORITY CLAIM AND CROSS-REFERENCE

This application is a continuation of U.S. patent application Ser. No. 16/207,832, filed Dec. 3, 2018, which is a divisional of U.S. patent application Ser. No. 14/671,477, filed Mar. 27, 2015, now U.S. Pat. No. 10,147,692, issued on Dec. 4, 2018, which is a continuation-in-part of U.S. patent application Ser. No. 14/605,848, filed on Jan. 26, 2015, entitled "Package with UBM and Methods of Forming," now U.S. Pat. No. 10,269,752, issued on Apr. 23, 2019, which claims priority to and the benefit of U.S. Provisional Application No. 62/050,550, filed on Sep. 15, 2014, entitled "UBM Metal Profile for Reliability Improvement," which applications are hereby incorporated herein by reference in their entireties.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, such as individually or in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
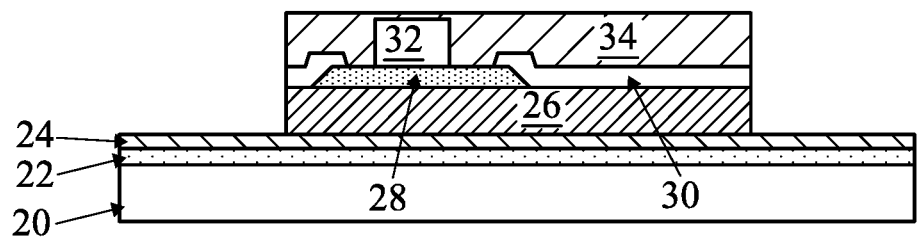
FIGS. 1 through 14 are cross-sectional views of intermediate steps during a process for forming a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure with a fan-out or fan-in wafer-level package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 14 illustrate cross-sectional views of intermediate steps during a process for forming a package structure in accordance with some embodiments. FIG. 1 illustrates a carrier substrate 20 and a release layer 22 formed on the carrier substrate 20. The carrier substrate 20 may be a glass carrier substrate, a ceramic carrier substrate, or the like. The carrier substrate 20 may be a wafer. The release layer 22 may be formed of a polymer-based material, which may be removed along with the carrier substrate 20 from the overlying structures that will be formed in subsequent steps. In some embodiments, the release layer 22 is an epoxy-based thermal-release material, which loses its adhesive property when heated, such as a Light-to-Heat-Conversion (LTHC) release coating. In other embodiments, the release layer 22 may be an ultra-violet (UV) glue, which loses its adhesive property when exposed to UV lights. The release layer 22 may be dispensed as a liquid and cured, may be a laminate film laminated onto the carrier substrate 20, or may be the like. An adhesive 24 can be formed or dispensed on the release layer 22. The adhesive 24 can be a die attach film (DAF), a glue, a polymer material, or the like.

Integrated circuit die 26 is adhered to the carrier substrate 20 (e.g., through the release layer 22) by the adhesive 24. As illustrated, one integrated circuit die 26 is adhered, and in other embodiments, more integrated circuit dies may be adhered. Before being adhered to the carrier substrate 20, the integrated circuit die 26 may be processed according to applicable manufacturing processes to form an integrated circuit in the integrated circuit die 26. For example, the integrated circuit die 26 comprises a bulk semiconductor substrate, a semiconductor-on-insulator (SOI) substrate, multi-layered or gradient substrates, or the like. The semiconductor of the substrate may include any semiconductor material, such as elemental semiconductor like silicon, germanium, or the like; a compound or alloy semiconductor including SiC, GaAs, GaP, InP, InAs, indium antimonide, SiGe, GaAsP, AlInAs, AlGaAs, GaInAs, GaInP, and/or GaInAsP; the like; or combinations thereof. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

The integrated circuit die 26 further comprises pads 28, such as aluminum pads, to which external connections are made. The pads 28 are on what may be referred to as an active side of the integrated circuit die 26. A passivation film 30 is on the integrated circuit die 26 and on portions of the pads 28. Openings are through the passivation film 30 to the pads 28. Die connectors 32, such as conductive pillars (for example, comprising a metal such as copper), are in the openings through passivation film 30 and are mechanically and electrically coupled to the respective pads 28. The die connectors 32 may be formed by, for example, plating or the like. The die connectors 32 electrically couple the integrated circuit of the integrate circuit die 26. One pad 28 and one die connector 32 are illustrated on the integrated circuit die 26 for clarity and simplicity, and one of ordinary skill in the art will readily understand that more than one pad 28 and more than one die connector 32 may be present.

A dielectric material 34 is on the active side of the integrated circuit die 26, such as on the passivation film 30 and the die connectors 32. The dielectric material 34 laterally encapsulates the die connectors 32, and the dielectric material 34 is laterally co-terminus with the integrated circuit die 26. The dielectric material 34 may be a polymer, such as polybenzoxazole (PBO), polyimide, benzocyclobutene (BCB), or the like. In other embodiments, the dielectric material 34 is formed of a nitride such as silicon nitride; an oxide such as silicon oxide, PhosphoSilicate Glass (PSG), BoroSilicate Glass (BSG), Boron-doped PhosphoSilicate Glass (BPSG), or the like; or the like. The dielectric material 34 may be formed by any acceptable deposition process, such as spin coating, chemical vapor deposition (CVD), laminating, the like, or a combination thereof. The integrated circuit die 26 may be singulated, such as by sawing or dicing, and adhered to the carrier substrate 20 by the adhesive 24 using, for example, a pick-and-place tool.

Figure 2:
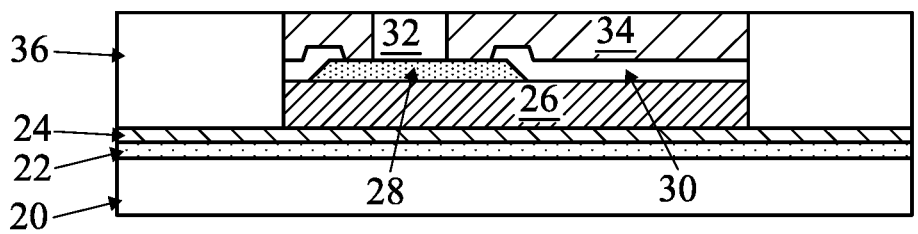

In FIG. 2, an encapsulant 36 is formed on the adhesive 24 around the integrated circuit die 26 and/or on the various components on the integrated circuit die 26. The encapsulant 36 may be a molding compound, epoxy, or the like, and may be applied by compression molding, transfer molding, or the like. After curing, the encapsulant 36 can undergo a grinding process to expose the die connectors 32. Top surfaces of the die connectors 32, dielectric material 34, and encapsulant 36 are co-planar after the grinding process. In some embodiments, the grinding may be omitted, for example, if the die connectors 32 are already exposed.

Figure 3:
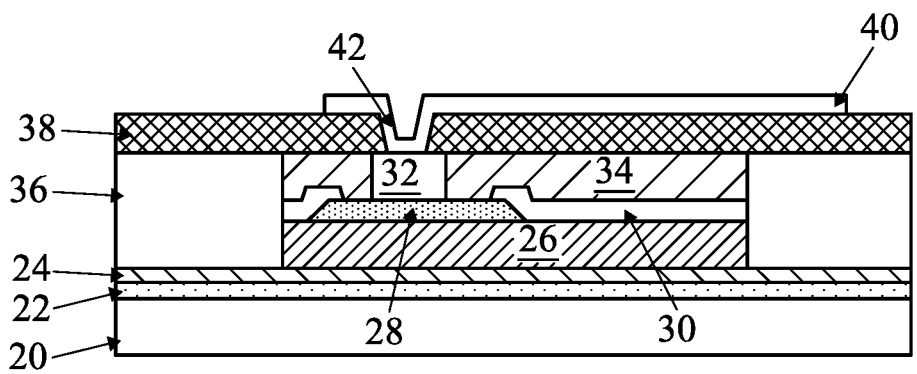
Figure 15:
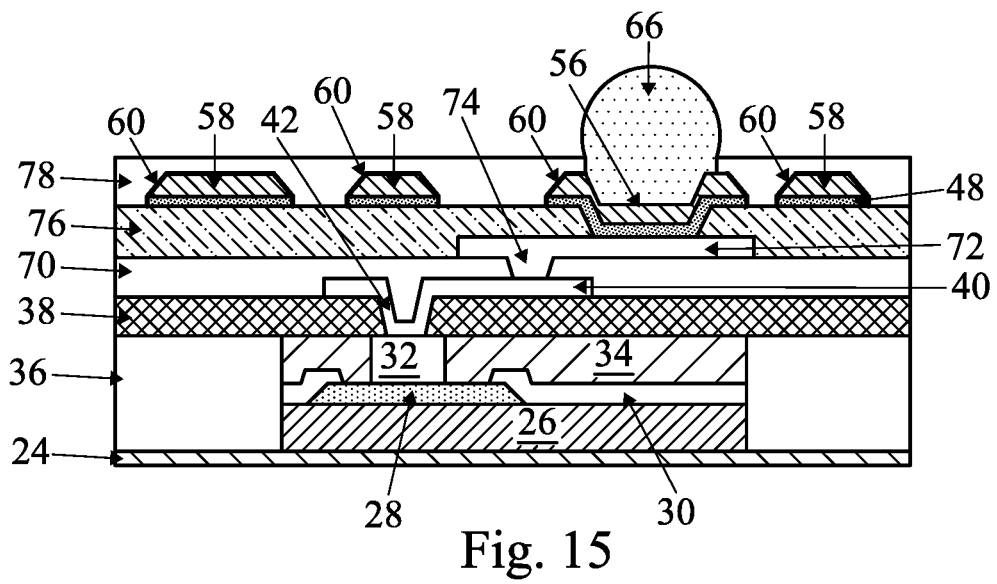
FIG. 15 is a cross-sectional view of a package structure in accordance with some embodiments.
Figure 16:
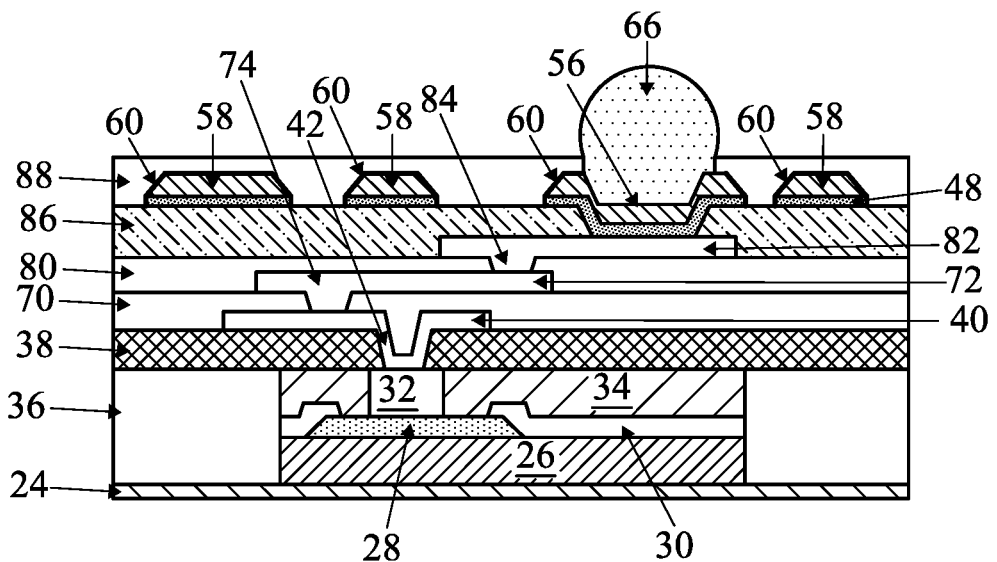
FIG. 16 is a cross-sectional view of a package structure in accordance with some embodiments.
Figure 17:
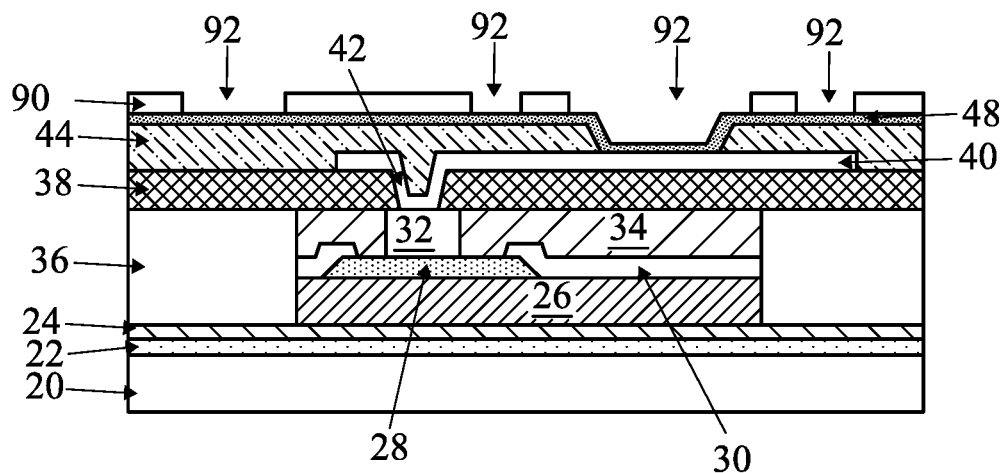
FIGS. 17, 18, 19A, 20, and 21 are cross-sectional views of intermediate steps during a process for forming a package structure in accordance with some embodiments.

In FIG. 3, a first dielectric layer 38 and first metallization pattern 40 of a redistribution structure are formed. FIG. 3 and figures that follow illustrate an example configuration of the redistribution structure, and in other embodiments, the redistribution structure can comprise any number of dielectric layers, metallization patterns, and vias, such as shown in FIGS. 15 and 16.

The first dielectric layer 38 is formed on the encapsulant 36, the dielectric material 34, and the die connectors 32. In some embodiments, the first dielectric layer 38 is formed of a polymer, which may be a photo-sensitive material such as PBO, polyimide, BCB, or the like, that may be easily patterned using a lithography mask. In other embodiments, the first dielectric layer 38 is formed of a nitride such as silicon nitride; an oxide such as silicon oxide, PSG, BSG, BPSG; or the like. The first dielectric layer 38 may be formed by spin coating, lamination, CVD, the like, or a combination thereof. The first dielectric layer 38 is then patterned to form openings to expose portions of the die connectors 32. The patterning may be by an acceptable process, such as by exposing the first dielectric layer 38 to light when the dielectric layer is a photo-sensitive material or by etching using, for example, an anisotropic etch.

The first metallization pattern 40 with vias 42 is formed on the first dielectric layer 38. As an example to form the first metallization pattern 40 and vias 42, a seed layer (not shown) is formed over the first dielectric layer 38. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, Physical Vapor Deposition (PVD) or the like. A photo resist is then formed and patterned on the seed layer. The photo resist may be formed by spin coating or the like and may be exposed to light for patterning. The pattern of the photo resist corresponds to the first metallization pattern 40. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the first metallization pattern 40 and vias 42. The vias 42 are formed in openings through the underlying layer, e.g., the first dielectric layer 38.

One or more additional metallization patterns with vias and dielectric layers may be formed in the redistribution structure by repeating the processes for forming the first dielectric layer 38 and the first metallization pattern 40. The vias may be formed during the formation of a metallization pattern as discussed. The vias may therefore interconnect and electrically couple the various metallization patterns. The depiction of one dielectric layer, e.g., the first dielectric layer 38, and one metallization pattern, e.g., the first metallization pattern 40, is for ease and simplicity of illustration.

Figure 4:
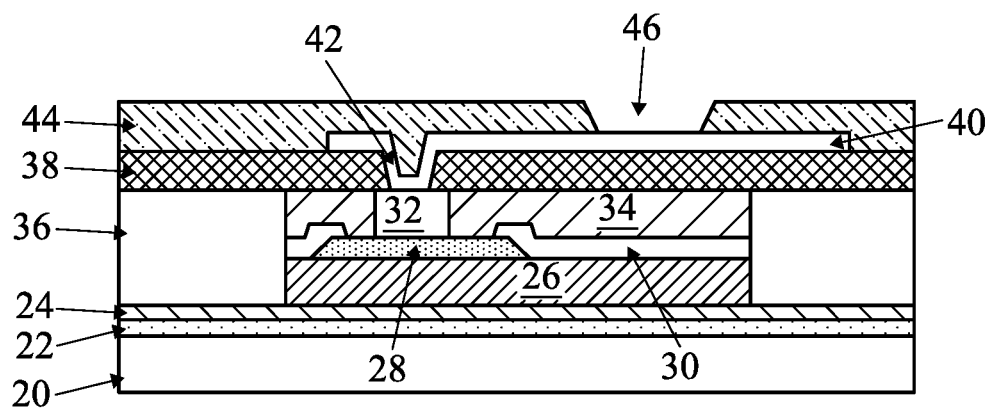

In FIG. 4, a second dielectric layer 44 is formed on the first metallization pattern 40 and the first dielectric layer 38. In some embodiments, the second dielectric layer 44 is formed of a polymer, which may be a photo-sensitive material such as PBO, polyimide, BCB, or the like, that may be easily patterned using a lithography mask. In other embodiments, the second dielectric layer 44 is formed of a nitride such as silicon nitride; an oxide such as silicon oxide, PSG, BSG, BPSG; or the like. The second dielectric layer 44 may be formed by spin coating, lamination, CVD, the like, or a combination thereof. The second dielectric layer 44 is then patterned to form openings 46 to expose portions of the first metallization pattern 40. The patterning may be by an acceptable process, such as by exposing the second dielectric layer 44 to light when the dielectric layer is a photo-sensitive material or by etching using, for example, an anisotropic etch.

Figure 5:
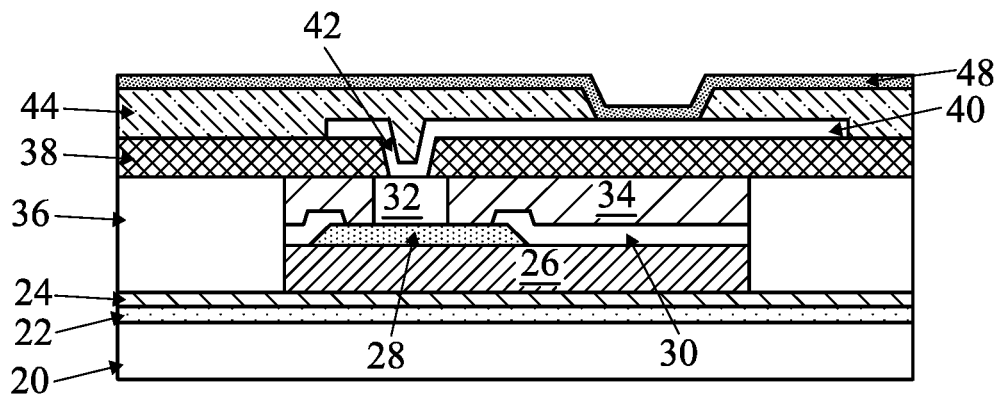

FIGS. 5 through 13 illustrate formation of Under Ball Metallizations (UBMs) 56 and external electrical connectors 66 on respective ones of the UBMs 56. In FIG. 5, a seed layer 48 is formed over the second dielectric layer 44 and in the opening 46, e.g., on sidewalls of the second dielectric layer 44 and on the first metallization pattern 40. In some embodiments, the seed layer 48 is a metal layer, which may be a single layer or a composite layer comprising a plurality of sub-layers formed of different materials. In some embodiments, the seed layer 48 comprises a titanium layer and a copper layer over the titanium layer. The seed layer 48 may be formed using, for example, PVD or the like.

Figure 6:
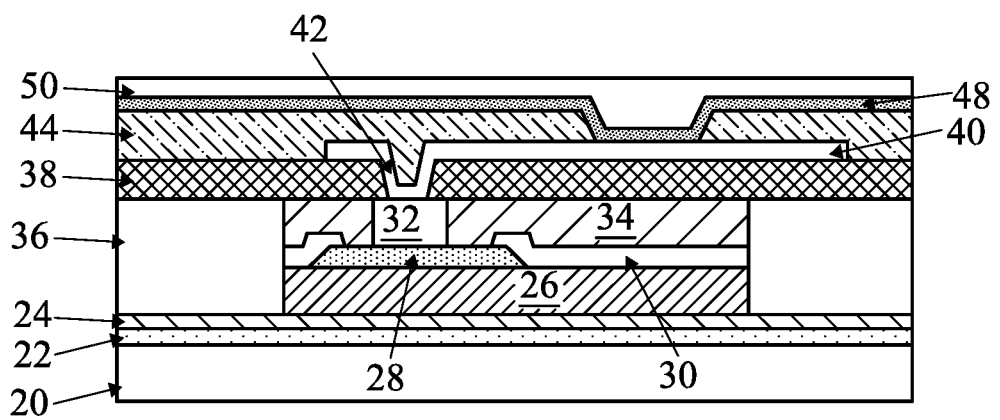

In FIG. 6, a photo resist 50 is then formed on the seed layer 48. In this embodiment, the photo resist 50 is a negative tone photo resist material. The photo resist 50 may be formed on the seed layer by spin coating or the like.

Figure 7:
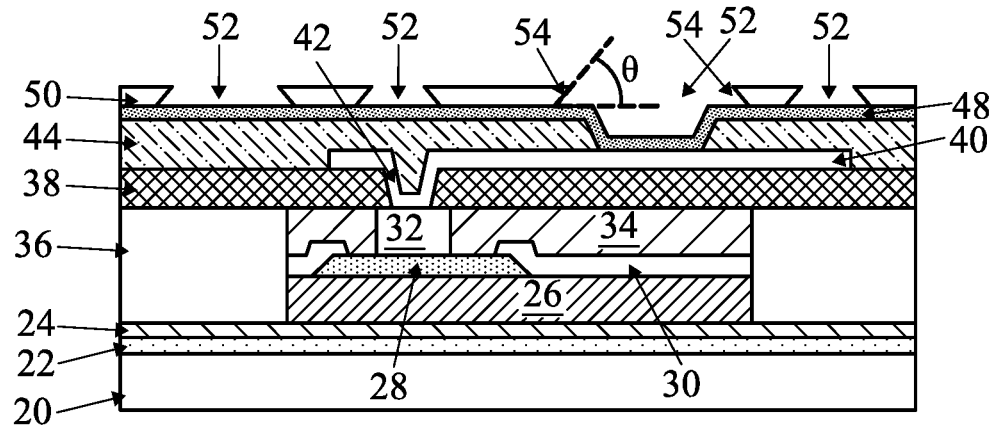

In FIG. 7, the photo resist 50 is patterned on the seed layer 48. The photo resist 50 may be exposed to light and subsequently developed for patterning. Using a negative tone photo resist, portions of the photo resist 50 that are exposed to the light remain after the patterning. After the exposure to light, the photo resist 50 is developed to remove soluble portions of the photo resist 50 such that the non-soluble portions of the photo resist 50 remain on the seed layer 48 with openings 52 through the photo resist 50. The openings 52 can have sloped sidewalls 54, e.g., sidewalls that are not perpendicular to a major surface underlying the photo resist 50 such as of the seed layer 48 and/or the second dielectric layer 44. As depicted, the sloped sidewalls 54 slope inwardly toward the opening in a direction extending away from the underlying major surface. Respective angles θ of the sloped sidewalls 54 with the immediately underlying surface in the openings 52 are less than 90°, such as between about 60° and about 85°. The pattern of the photo resist 50 corresponds to the UBMs 56 or other metallization patterns that will be formed.

Figure 8:
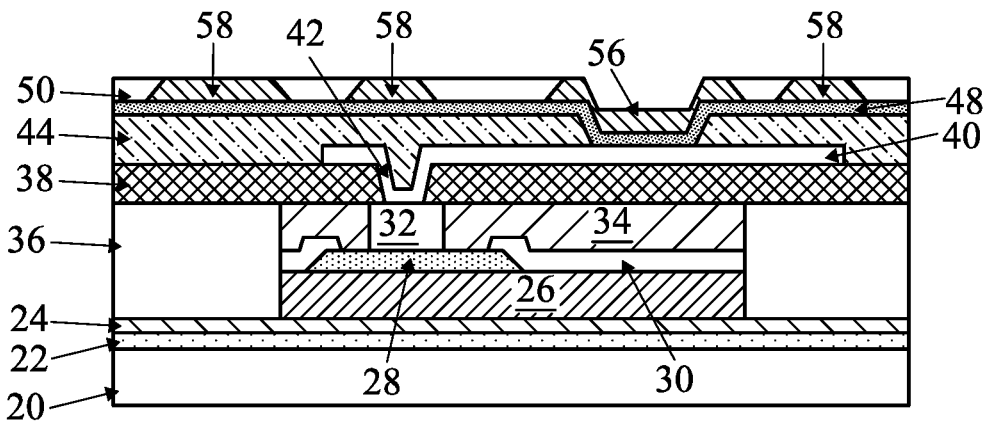

In FIG. 8, UBMs 56 and upper metallization pattern 58 are formed in respective openings 52 of the photo resist 50 and on the seed layer 48. A conductive material is formed in the openings 52 of the photo resist 50 and on the exposed portions of the seed layer 48, such as by plating, such as electroplating or electroless plating, or the like. The conductive material may comprise a metal, like copper, titanium, tungsten, aluminum, or the like. The UBMs 56 and upper metallization pattern 58 can also have sloped sidewalls that correspond to the sloped sidewalls 54 of the photo resist 50. Hence, angles formed by the sidewalls of the UBMs 56 and upper metallization pattern 58 with the underlying major surface may be less than 90°, such as between about 60° and about 85°.

Figure 9:
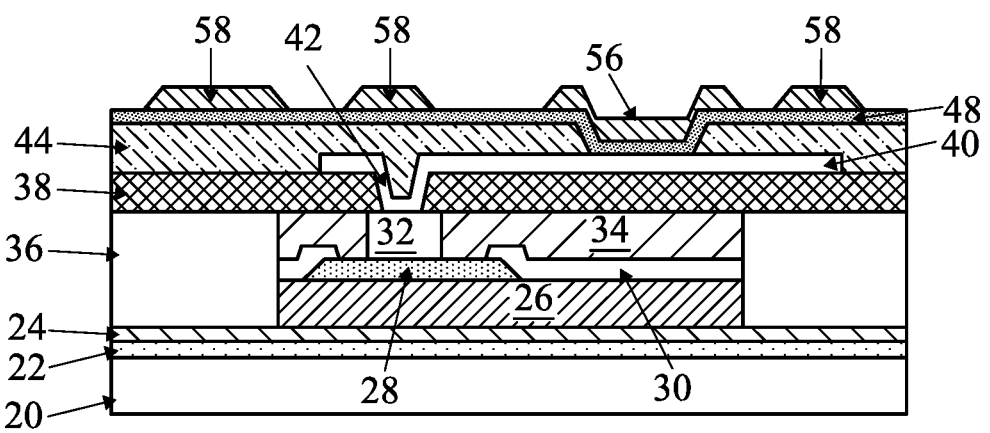
Figure 10:
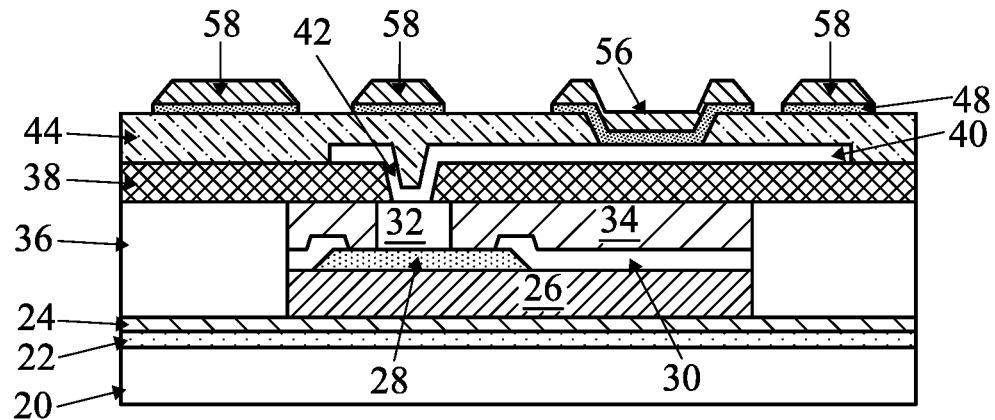

Then, in FIG. 9, the photo resist 50 is removed. The photo resist may be removed by an acceptable ashing or stripping process, such as using an oxygen plasma or the like. In FIG. 10, portions of the seed layer 48 on which the conductive material is not formed are removed. The exposed portions of the seed layer 48 are removed, for example, by using an acceptable etching process, such as by wet or dry etching. The remaining portions of the seed layer 48 and conductive material form the UBMs 56 and upper metallization pattern 58. As depicted the UBMs 56, with their corresponding portions of the seed layer 48, are formed in the openings 46 through the second dielectric layer 44 and are on the first metallization pattern 40. Hence, the UBMs 56 can be electrically coupled to the first metallization pattern 40.

Figure 11:
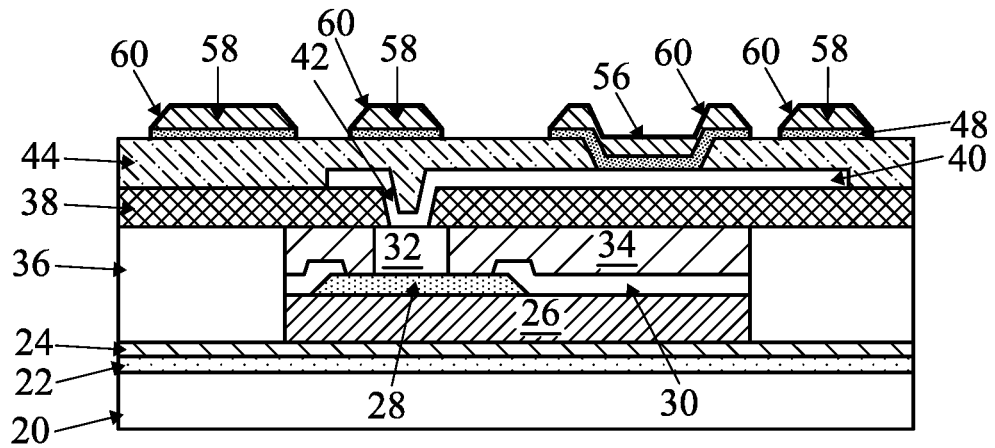

In FIG. 11, an adhesion layer 60 is formed on exterior surfaces of the UBMs 56 and upper metallization pattern 58. The adhesion layer 60 can be an oxide. For example, when the UBMs 56 and upper metallization pattern 58 comprise copper, the adhesion layer 60 can comprise copper oxide. The adhesion layer 60 can be formed by using an acceptable treatment, such as an oxidation treatment or the like. In some embodiments, the surfaces of the UBMs 56 and upper metallization pattern 58 can be exposed to a plasma containing an oxygen species, for example, an oxygen ($O_2$) plasma, an ozone ($O_3$) plasma, a combination of an inert gas and an oxygen-containing gas such as a combination of nitrogen ($N_2$) and oxygen ($O_2$), or the like. Other treatments may be used, and other adhesion layers may be formed.

Figure 12:
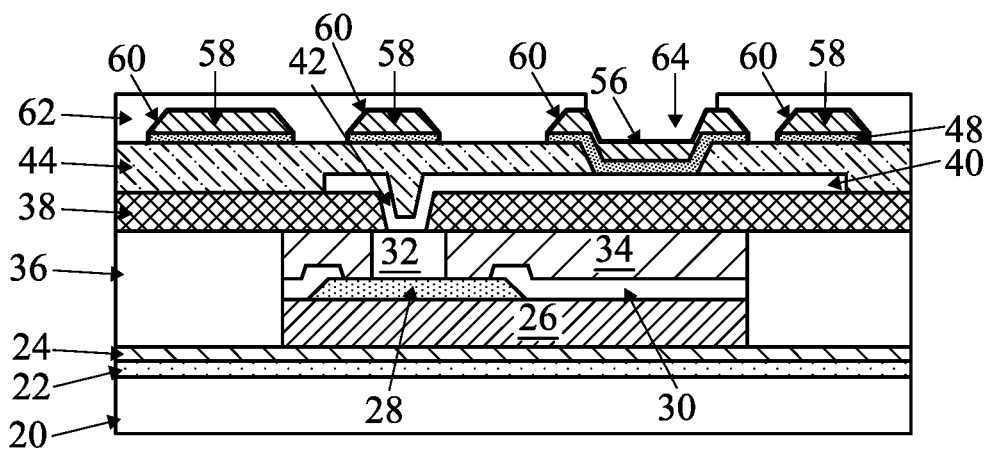

In FIG. 12, a third dielectric layer 62 is formed on the UBMs 56, upper metallization pattern 58, and the second dielectric layer 44. In some embodiments, the third dielectric layer 62 is formed of a polymer, which may be a photo-sensitive material such as PBO, polyimide, BCB, or the like, that may be easily patterned using a lithography mask. In other embodiments, the third dielectric layer 62 is formed of a nitride such as silicon nitride; an oxide such as silicon oxide, PSG, BSG, BPSG; or the like. The third dielectric layer 62 may be formed by spin coating, lamination, CVD, the like, or a combination thereof. The third dielectric layer 62 is then patterned to form openings 64 to expose portions of the UBMs 56 and/or of the adhesion layer 60 on the UBMs 56. The patterning may be by an acceptable process, such as by exposing the third dielectric layer 62 to light when the dielectric layer is a photo-sensitive material or by etching using, for example, an anisotropic etch.

Figure 13:
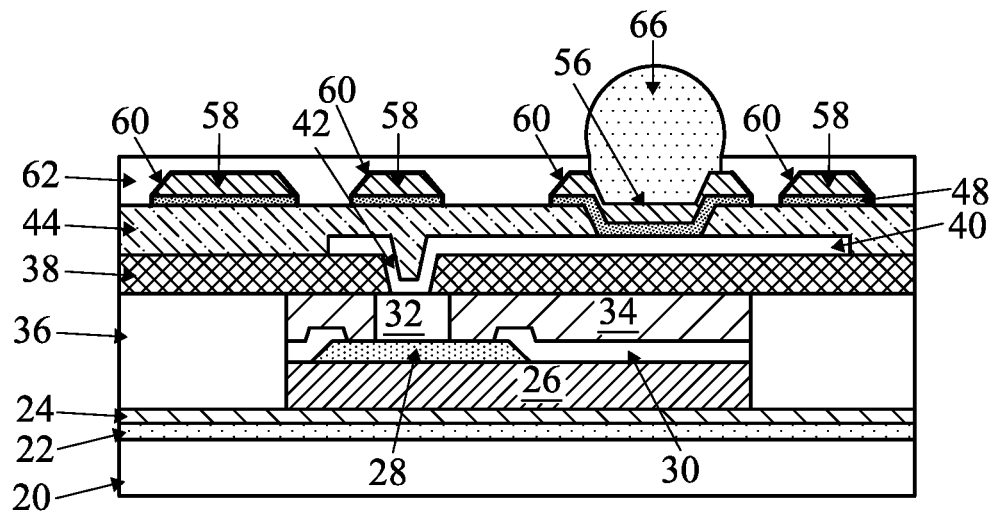

In FIG. 13, portions of the adhesion layer 60 exposed through openings 64 are removed, and external electrical connectors 66 are formed on the UBMs 56 through the openings 64. In some embodiments, the exposed portions of the adhesion layer 60 are removed when the external electrical connectors 66 are formed, for example, by a flux during a ball mount process. In some embodiments, the external electrical connectors 66 can include low-temperature reflowable material, such as solder, such as a lead-free solder, formed on the UBMs 56 using an acceptable ball drop process. In some embodiments, the external electrical connectors 66 are ball grid array (BGA) balls, controlled collapse chip connection (C4) bumps, microbumps, or the like. In additional embodiments, the external electrical connectors 66 can include metal pillars.

Figure 14:
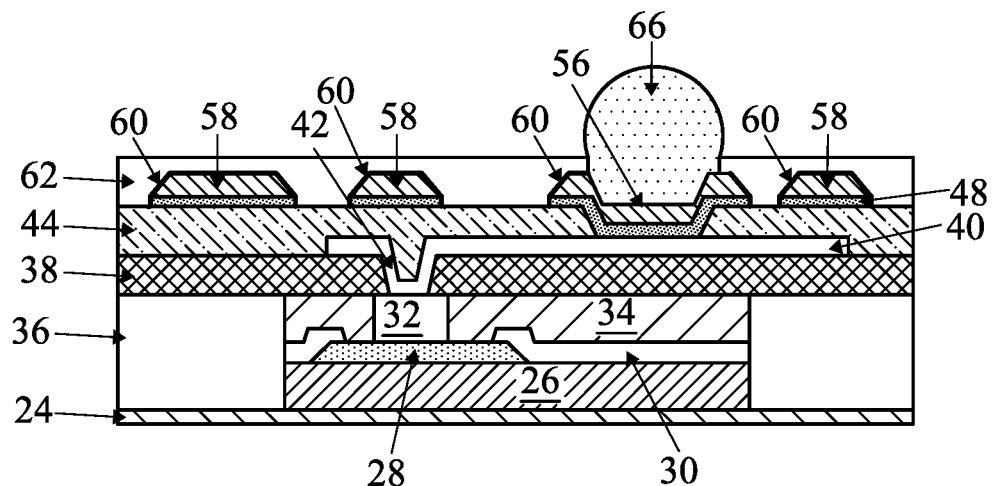

In FIG. 14, a carrier substrate de-bonding is performed to detach (de-bond) carrier substrate 20 from the package structure. In accordance with some embodiments, the de-bonding includes projecting a light such as a laser light or an UV light on release layer 22 so that release layer 22 decomposes under the heat of the light and carrier substrate 20 can be removed.

Although not depicted, the structure can then be flipped over and placed on a tape and singulated. One of ordinary skill in the art will understand that many such package structures may be simultaneously formed on the carrier substrate 20, and hence, individual packages, such as depicted in FIG. 14, can be singulated from the other packages, such as by sawing or dicing.

FIG. 15 illustrates another cross-sectional view of a package structure in accordance with some embodiments. In the embodiment depicted in FIG. 15, the redistribution structure comprises an additional dielectric layer and metallization pattern. To form this package structure, a process may proceed through the steps discussed above with respect to FIGS. 1 through 3. Then, a second dielectric layer 70 can be formed on the first dielectric layer 38 and first metallization pattern 40. The second dielectric layer 70 can be a same or similar material and can be formed in a same or similar manner as described above with respect to the first dielectric layer 38. The second dielectric layer 70 is then patterned to form openings to expose portions of the first metallization pattern 40, such as in a same or similar manner as discussed above with respect to the first dielectric layer 38. A second metallization pattern 72 with vias 74 is formed on the second dielectric layer 70 and in the openings through the second dielectric layer 70, such as with a same or similar material and in a same or similar manner as described above with respect to the first metallization pattern 40 and vias 42. The vias 74 electrically couple the first metallization pattern 40 to the second metallization pattern 72. The process may then proceed as discussed above with respect to FIGS. 4 through 14, where the second dielectric layer 44 and the third dielectric layer 62 correspond to a third dielectric layer 76 and a fourth dielectric layer 78, respectively, in FIG. 15.

FIG. 16 illustrates a further cross-sectional view of a package structure in accordance with some embodiments. In the embodiment depicted in FIG. 16, the redistribution structure comprises additional dielectric layers and metallization patterns. To form this package structure, a process may proceed through the steps discussed above with respect to FIGS. 1 through 3. Then, a second dielectric layer 70 can be formed on the first dielectric layer 38 and first metallization pattern 40. The second dielectric layer 70 can be a same or similar material and can be formed in a same or similar manner as described above with respect to the first dielectric layer 38. The second dielectric layer 70 is then patterned to form openings to expose portions of the first metallization pattern 40, such as in a same or similar manner as discussed above with respect to the first dielectric layer 38. A second metallization pattern 72 with vias 74 is formed on the second dielectric layer 70 and in the openings through the second dielectric layer 70, such as with a same or similar material and in a same or similar manner as described above with respect to the first metallization pattern 40 and vias 42. The vias 74 electrically couple the first metallization pattern 40 to the second metallization pattern 72.

Then, a third dielectric layer 80 can be formed on the second dielectric layer 70 and second metallization pattern 72. The third dielectric layer 80 can be a same or similar material and can be formed in a same or similar manner as described above with respect to the first dielectric layer 38. The third dielectric layer 80 is then patterned to form openings to expose portions of the second metallization pattern 72, such as in a same or similar manner as discussed above with respect to the first dielectric layer 38. A third metallization pattern 82 with vias 84 is formed on the third dielectric layer 80 and in the openings through the third dielectric layer 80, such as with a same or similar material and in a same or similar manner as described above with respect to the first metallization pattern 40 and vias 42. The vias 84 electrically couple the second metallization pattern 72 to the third metallization pattern 82. The process may then proceed as discussed above with respect to FIGS. 4 through 14, where the second dielectric layer 44 and the third dielectric layer 62 correspond to a fourth dielectric layer 86 and a fifth dielectric layer 88, respectively, in FIG. 16.

FIGS. 17 through 21 illustrate cross-sectional views of intermediate steps during a process for forming a package structure in accordance with some embodiments. Processing proceeds as discussed above with respect to FIGS. 1 through 5. Then, in FIG. 17, a photo resist 90 is formed on the seed layer 48. In this embodiment, the photo resist 90 can be a positive tone or a negative tone photo resist material. The photo resist 90 may be formed on the seed layer 48 by spin coating or the like. The photo resist 90 is patterned on the seed layer 48. The photo resist 90 may be exposed to light and subsequently developed for patterning. After the exposure to light, the photo resist 90 is developed to remove soluble portions of the photo resist 90 such that the non-soluble portions of the photo resist 90 remain on the seed layer 48 with openings 92 through the photo resist 90. The openings 92 can have sloped sidewalls or vertical sidewalls. The pattern of the photo resist 90 corresponds to the UBMs 94, dummy patterns 96, or other metallization patterns that will be formed.

Figure 18:
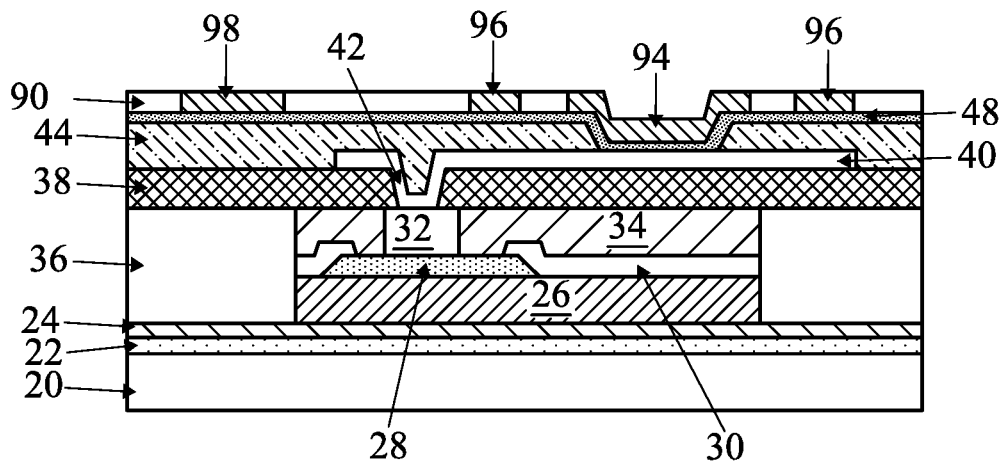

In FIG. 18, UBMs 94, dummy patterns 96, and upper metallization pattern 98 are formed in respective openings 92 of the photo resist 90 and on the seed layer 48. A conductive material is formed in the openings 92 of the photo resist 90 and on the exposed portions of the seed layer 48, such as by plating, such as electroplating or electroless plating, or the like. The conductive material may comprise a metal, like copper, titanium, tungsten, aluminum, or the like. The UBMs 94, dummy patterns 96, and upper metallization pattern 98 can also have sidewalls that correspond to the sidewalls of the openings 92 of the photo resist 90.

Figure 19A:
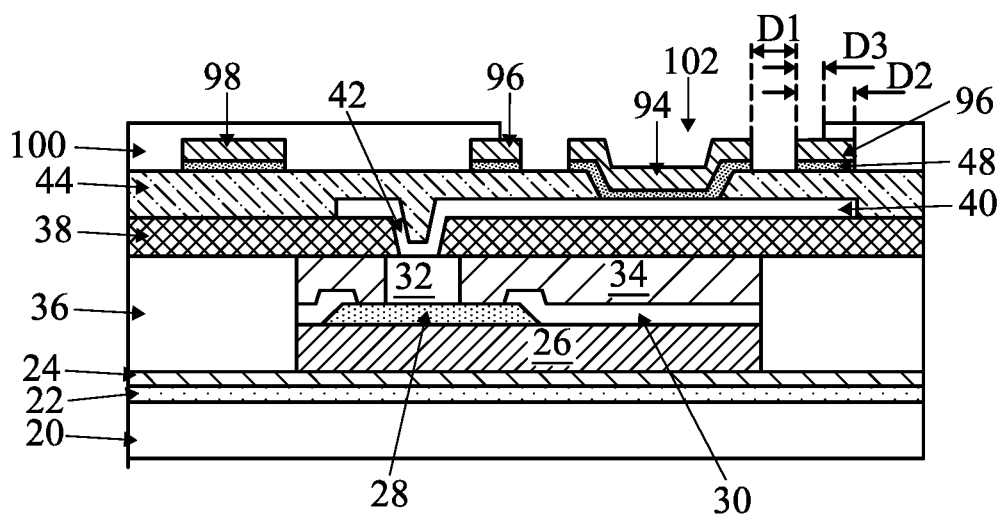

Then, in FIG. 19A, the photo resist 50 is removed; exposed portions of the seed layer 48 are removed; and a third dielectric layer 100 is formed on the dummy patterns 96, the upper metallization pattern 98, and the second dielectric layer 44. The photo resist may be removed by an acceptable ashing or stripping process, such as using an oxygen plasma or the like. Portions of the seed layer 48 on which the conductive material is not formed are then removed. The exposed portions of the seed layer 48 are removed, for example, by using an acceptable etching process, such as by wet or dry etching. The remaining portions of the seed layer 48 and conductive material form the UBMs 94, the dummy patterns 96, and upper metallization pattern 98. As depicted the UBMs 94, with their corresponding portions of the seed layer 48, are formed in the openings 46 through the second dielectric layer 44 and are on the first metallization pattern 40. Hence, the UBMs 94 can be electrically coupled to the first metallization pattern 40. The dummy patterns 96 may be electrically isolated and not electrically coupled to another metallization or device. The upper metallization pattern 98 may be electrically coupled to another metallization pattern and/or device.

The third dielectric layer 100 is formed on the dummy patterns 96, upper metallization pattern 98, and the second dielectric layer 44. In some embodiments, the third dielectric layer 100 is formed of a polymer, which may be a photosensitive material such as PBO, polyimide, BCB, or the like, that may be easily patterned using a lithography mask. In other embodiments, the third dielectric layer 100 is formed of a nitride such as silicon nitride; an oxide such as silicon oxide, PSG, BSG, BPSG; or the like. The third dielectric layer 100 may be formed by spin coating, lamination, CVD, the like, or a combination thereof. The third dielectric layer 100 is then patterned to form openings 102, with each opening 102 exposing a UBM 94 to a portion of a neighboring dummy pattern 96. The patterning may be by an acceptable process, such as by exposing the third dielectric layer 100 to light when the dielectric layer is a photosensitive material or by etching using, for example, an anisotropic etch.

Figure 19B:
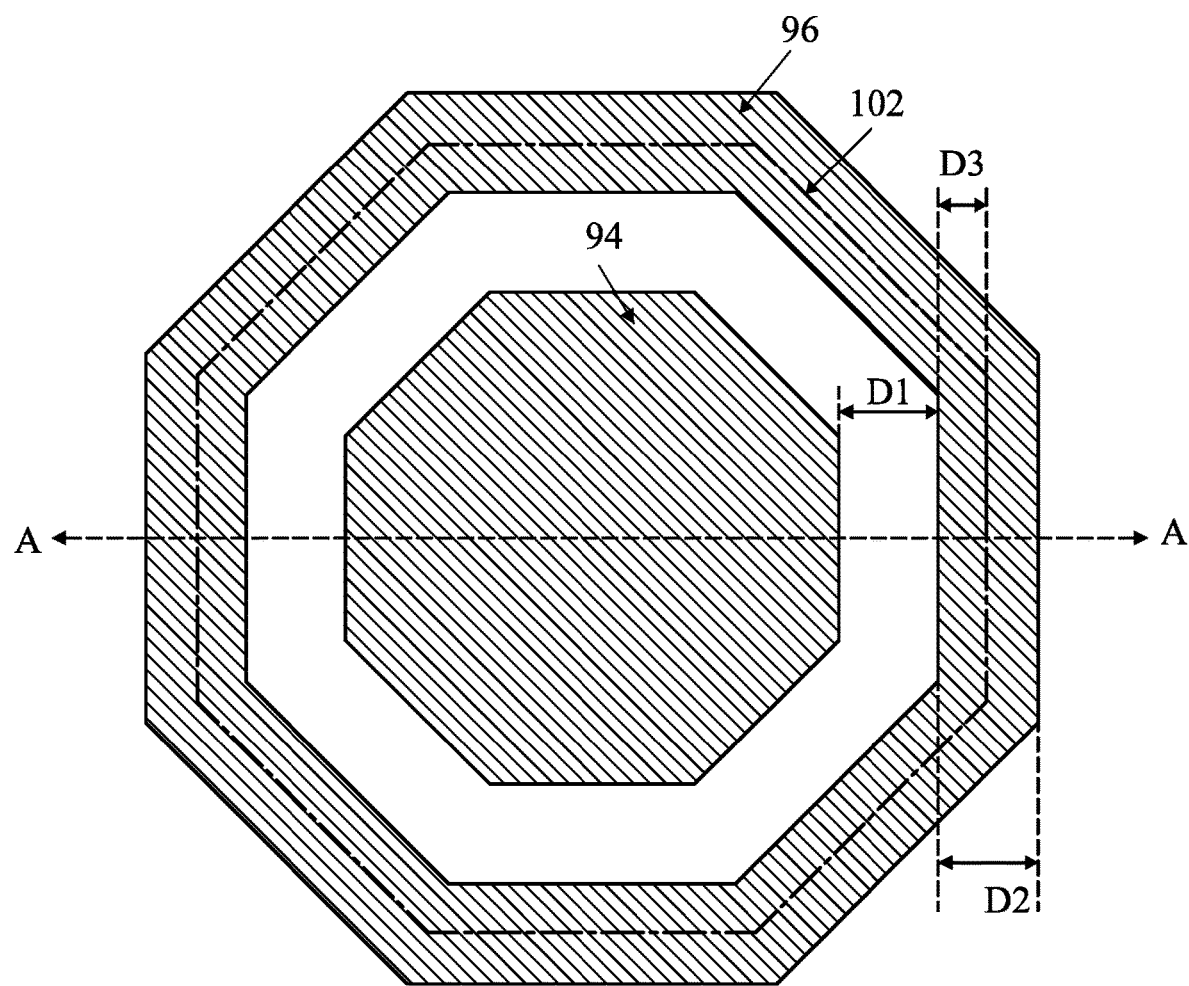
FIG. 19B is a layout view of an under ball metallization (UBM) and a dummy pattern in accordance with some embodiments.

FIG. 19B illustrates an example layout view of an UBM 94, a dummy pattern 96, and an opening 102 of the third dielectric layer 100 in accordance with some embodiments. In the layout view, the UBM 94 has an octagonal shape, and the dummy pattern 96 has an annular shape, such as an octagonal ring, around the UBM 94. The layout view of FIG. 19B illustrates a cross section A-A that is illustrated in FIG. 19A. FIGS. 19A and 19B illustrate a separation dimension D1 separating the UBM 94 from the dummy pattern 96. Additionally, FIGS. 19A and 19B illustrate a dimension D2 that is a width of the dummy pattern 96. In some embodiments, the separation dimension D1 is greater than or equal to about 40 μm, and the dimension D2 can be in a range from about 5 μm to about 10 μm.

The third dielectric layer 100 overlays at least a portion of the dummy pattern 96 but does not overlay the UBM 94. In the illustrated embodiment, the opening 102 has sidewalls that contact or interface with the dummy pattern 96 and not the second dielectric layer 44. There is no interface of the second dielectric layer 44 with the third dielectric layer 100 at the opening 102. A portion of the dummy pattern 96 is exposed by the opening 102, and the exposed portion of the dummy pattern 96 has a dimension D3. The dimension D3 can be about half of the dimension D2 or less.

Figure 20:
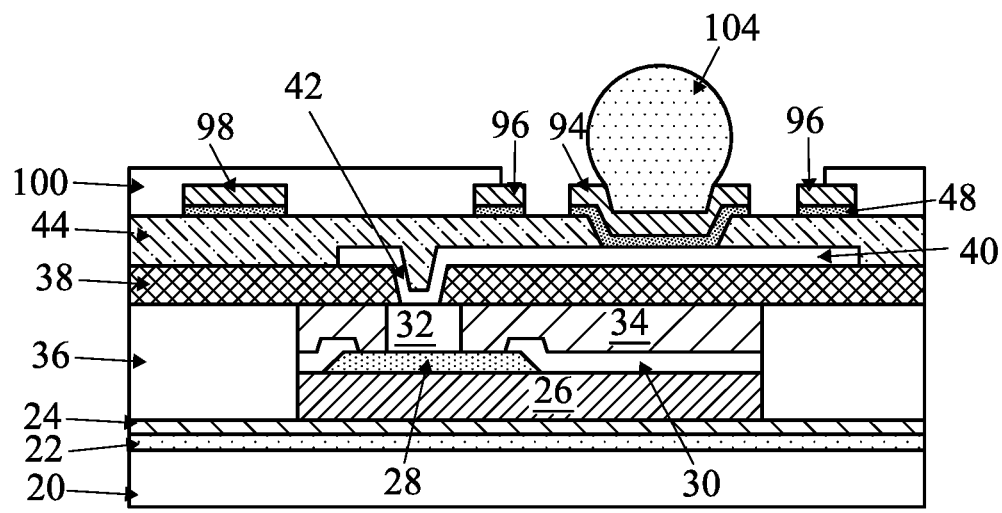

In FIG. 20, external electrical connectors 104 are formed on the UBMs 94 through the openings 102. In some embodiments, the external electrical connectors 104 can include low-temperature reflowable material, such as solder, such as a lead-free solder, formed on the UBMs 94 using an acceptable ball drop process. In some embodiments, the external electrical connectors 66 are BGA balls, C4 bumps, microbumps, or the like. In additional embodiments, the external electrical connectors 104 can include metal pillars.

Figure 21:
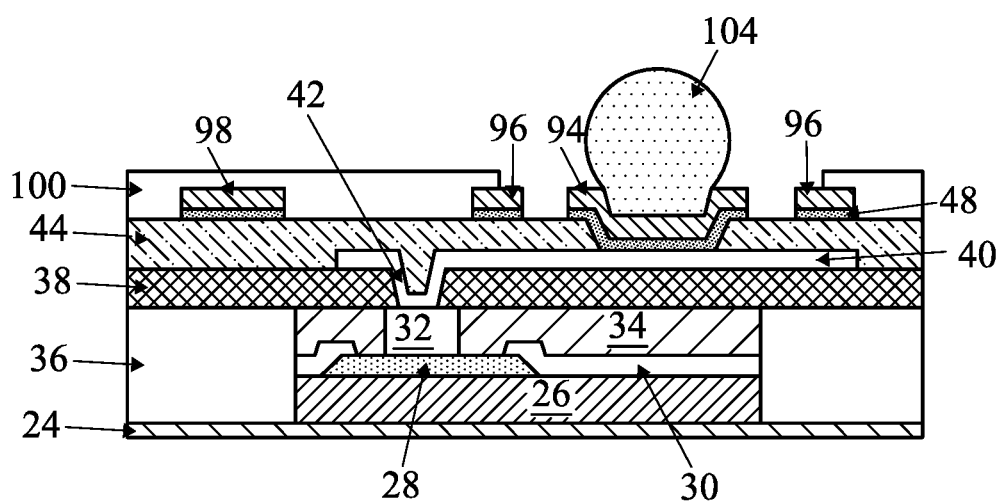

In FIG. 21, a carrier substrate de-bonding is performed to detach (de-bond) carrier substrate 20 from the package structure. In accordance with some embodiments, the de-bonding includes projecting a light such as a laser light or an UV light on release layer 22 so that release layer 22 decomposes under the heat of the light and carrier substrate 20 can be removed.

Although not depicted, the structure can then be flipped over and placed on a tape and singulated. One of ordinary skill in the art will understand that many such package structures may be simultaneously formed on the carrier substrate 20, and hence, individual packages, such as depicted in FIG. 21, can be singulated from the other packages, such as by sawing or dicing.

Figure 22:
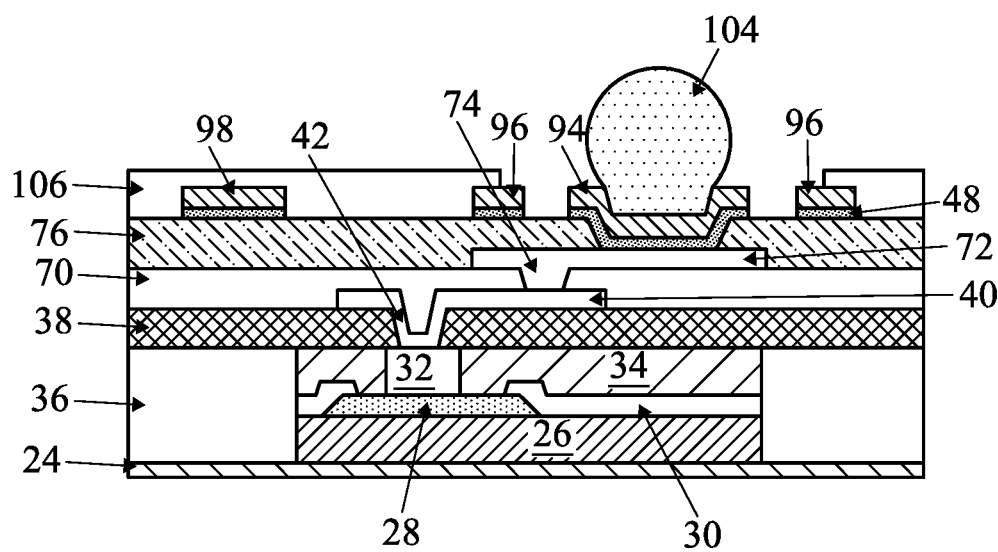
FIG. 22 is a cross-sectional view of a package structure in accordance with some embodiments.

FIG. 22 illustrates another cross-sectional view of a package structure in accordance with some embodiments. In the embodiment depicted in FIG. 22, the redistribution structure comprises an additional dielectric layer and metallization pattern. To form this package structure, a process may proceed through the steps discussed above with respect to FIGS. 1 through 3. Then, a second dielectric layer 70 can be formed on the first dielectric layer 38 and first metallization pattern 40. The second dielectric layer 70 can be a same or similar material and can be formed in a same or similar manner as described above with respect to the first dielectric layer 38. The second dielectric layer 70 is then patterned to form openings to expose portions of the first metallization pattern 40, such as in a same or similar manner as discussed above with respect to the first dielectric layer 38. A second metallization pattern 72 with vias 74 is formed on the second dielectric layer 70 and in the openings through the second dielectric layer 70, such as with a same or similar material and in a same or similar manner as described above with respect to the first metallization pattern 40 and vias 42. The vias 74 electrically couple the first metallization pattern 40 to the second metallization pattern 72. The process may then proceed as discussed above with respect to FIGS. 4, 5, and 17 through 21, where the second dielectric layer 44 and the third dielectric layer 100 correspond to a third dielectric layer 76 and a fourth dielectric layer 106, respectively, in FIG. 22.

Figure 23:
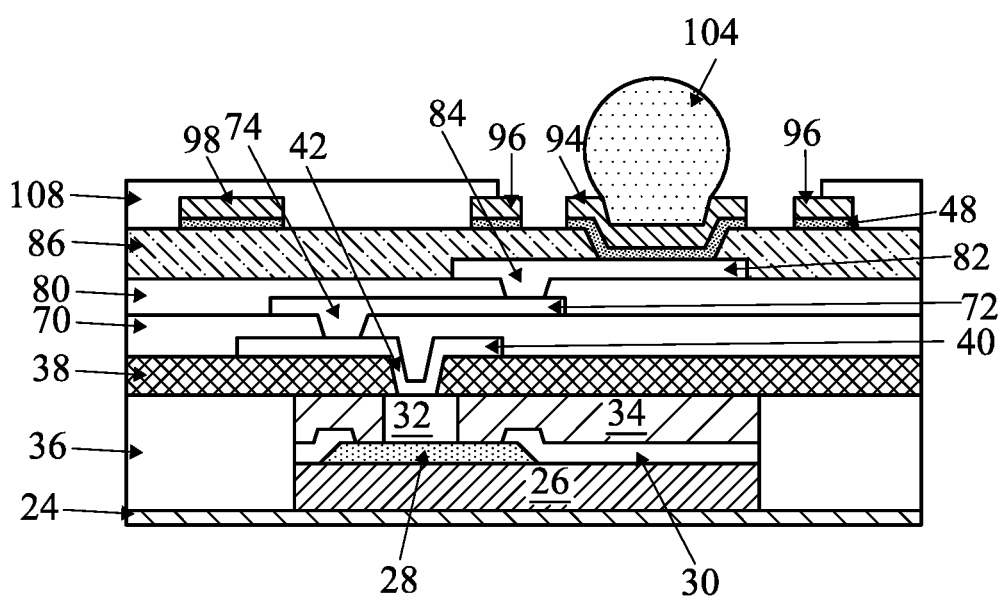
FIG. 23 is a cross-sectional view of a package structure in accordance with some embodiments.
Figure 24:
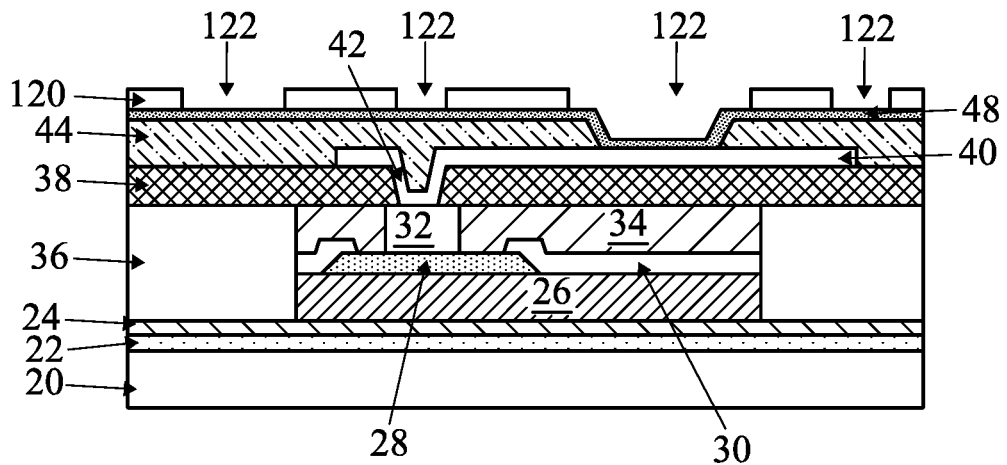
FIGS. 24, 25, 26A, 27, and 28 are cross-sectional views of intermediate steps during a process for forming a package structure in accordance with some embodiments.

FIG. 23 illustrates a further cross-sectional view of a package structure in accordance with some embodiments. In the embodiment depicted in FIG. 23, the redistribution structure comprises additional dielectric layers and metallization patterns. To form this package structure, a process may proceed through the steps discussed above with respect to FIGS. 1 through 3. Then, a second dielectric layer 70 can be formed on the first dielectric layer 38 and first metallization pattern 40. The second dielectric layer 70 can be a same or similar material and can be formed in a same or similar manner as described above with respect to the first dielectric layer 38. The second dielectric layer 70 is then patterned to form openings to expose portions of the first metallization pattern 40, such as in a same or similar manner as discussed above with respect to the first dielectric layer 38. A second metallization pattern 72 with vias 74 is formed on the second dielectric layer 70 and in the openings through the second dielectric layer 70, such as with a same or similar material and in a same or similar manner as described above with respect to the first metallization pattern 40 and vias 42. The vias 74 electrically couple the first metallization pattern 40 to the second metallization pattern 72.

Then, a third dielectric layer 80 can be formed on the second dielectric layer 70 and second metallization pattern 72. The third dielectric layer 80 can be a same or similar material and can be formed in a same or similar manner as described above with respect to the first dielectric layer 38. The third dielectric layer 80 is then patterned to form openings to expose portions of the second metallization pattern 72, such as in a same or similar manner as discussed above with respect to the first dielectric layer 38. A third metallization pattern 82 with vias 84 is formed on the third dielectric layer 80 and in the openings through the third dielectric layer 80, such as with a same or similar material and in a same or similar manner as described above with respect to the first metallization pattern 40 and vias 42. The vias 84 electrically couple the second metallization pattern 72 to the third metallization pattern 82. The process may then proceed as discussed above with respect to FIGS. 4, 5, and 17 through 21, where the second dielectric layer 44 and the third dielectric layer 100 correspond to a fourth dielectric layer 86 and a fifth dielectric layer 108, respectively, in FIG. 23.

FIGS. 24 through 28 illustrate cross-sectional views of intermediate steps during a process for forming a package structure in accordance with some embodiments. Processing proceeds as discussed above with respect to FIGS. 1 through 5. Then, in FIG. 24, a photo resist 120 is formed on the seed layer 48. In this embodiment, the photo resist 120 can be a positive tone or a negative tone photo resist material. The photo resist 120 may be formed on the seed layer 48 by spin coating or the like. The photo resist 120 is patterned on the seed layer 48. The photo resist 120 may be exposed to light and subsequently developed for patterning. After the exposure to light, the photo resist 120 is developed to remove soluble portions of the photo resist 120 such that the non-soluble portions of the photo resist 120 remain on the seed layer 48 with openings 122 through the photo resist 120. The openings 122 can have sloped sidewalls or vertical sidewalls. The pattern of the photo resist 120 corresponds to the UBMs 124 or upper metallization pattern 126 that will be formed.

Figure 25:
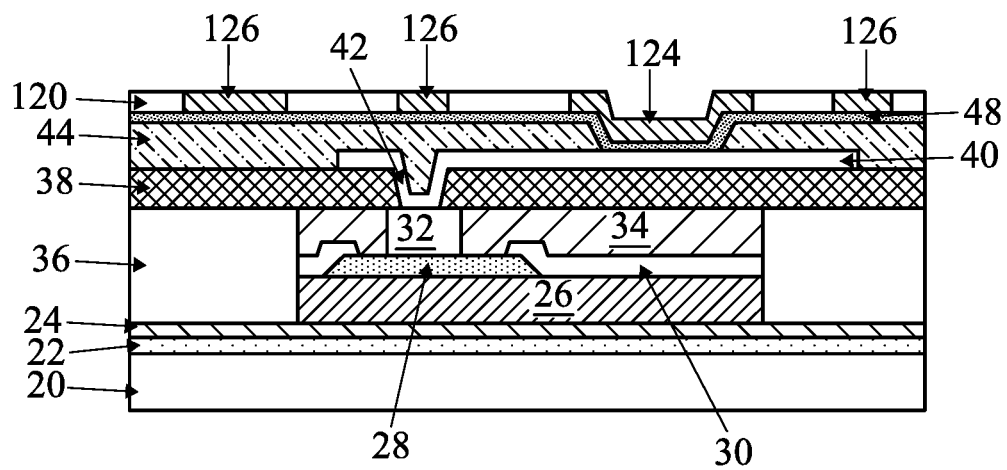

In FIG. 25, UBMs 124 and upper metallization pattern 126 are formed in respective openings 122 of the photo resist 120 and on the seed layer 48. A conductive material is formed in the openings 122 of the photo resist 120 and on the exposed portions of the seed layer 48, such as by plating, such as electroplating or electroless plating, or the like. The conductive material may comprise a metal, like copper, titanium, tungsten, aluminum, or the like. The UBMs 124 and upper metallization pattern 126 can also have sidewalls that correspond to the sidewalls of the openings 122 of the photo resist 120.

Figure 26A:
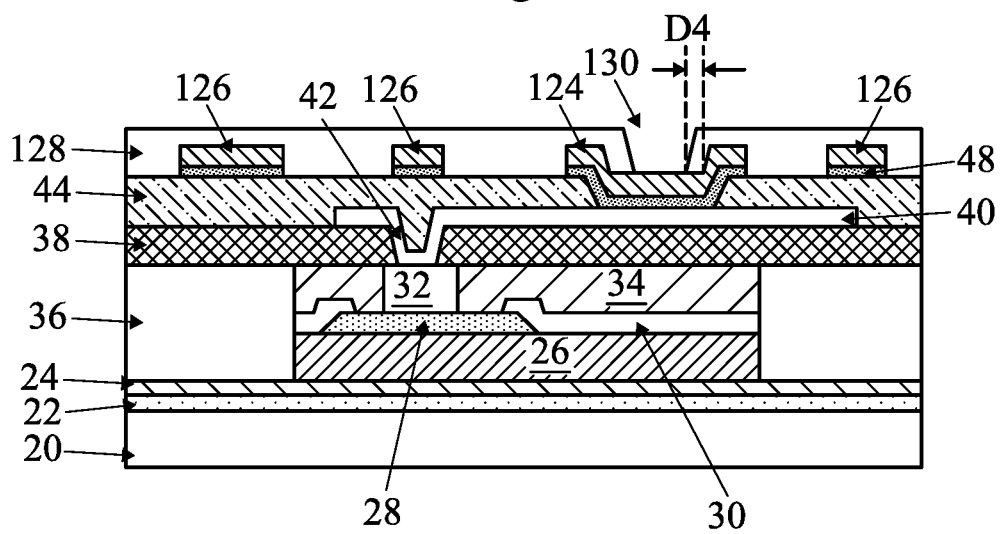

Then, in FIG. 26A, the photo resist 120 is removed; exposed portions of the seed layer 48 are removed; and a third dielectric layer 128 is formed on the upper metallization pattern 126, the second dielectric layer 44, and portions of the UBMs 124. The photo resist may be removed by an acceptable ashing or stripping process, such as using an oxygen plasma or the like. Portions of the seed layer 48 on which the conductive material is not formed are then removed. The exposed portions of the seed layer 48 are removed, for example, by using an acceptable etching process, such as by wet or dry etching. The remaining portions of the seed layer 48 and conductive material form the UBMs 124 and upper metallization pattern 126. As depicted the UBMs 124, with their corresponding portions of the seed layer 48, are formed in the openings 46 through the second dielectric layer 44 and are on the first metallization pattern 40. Hence, the UBMs 124 can be electrically coupled to the first metallization pattern 40.

The third dielectric layer 128 is formed on the upper metallization pattern 126, the second dielectric layer 44, and portions of the UBMs 124. In some embodiments, the third dielectric layer 128 is formed of a polymer, which may be a photo-sensitive material such as PBO, polyimide, BCB, or the like, that may be easily patterned using a lithography mask. In other embodiments, the third dielectric layer 128 is formed of a nitride such as silicon nitride; an oxide such as silicon oxide, PSG, BSG, BPSG; or the like. The third dielectric layer 128 may be formed by spin coating, lamination, CVD, the like, or a combination thereof. The third dielectric layer 128 is then patterned to form openings 130, with each opening 130 exposing a portion of a UBM 124. The patterning may be by an acceptable process, such as by exposing the third dielectric layer 128 to light when the dielectric layer is a photo-sensitive material or by etching using, for example, an anisotropic etch.

Figure 26B:
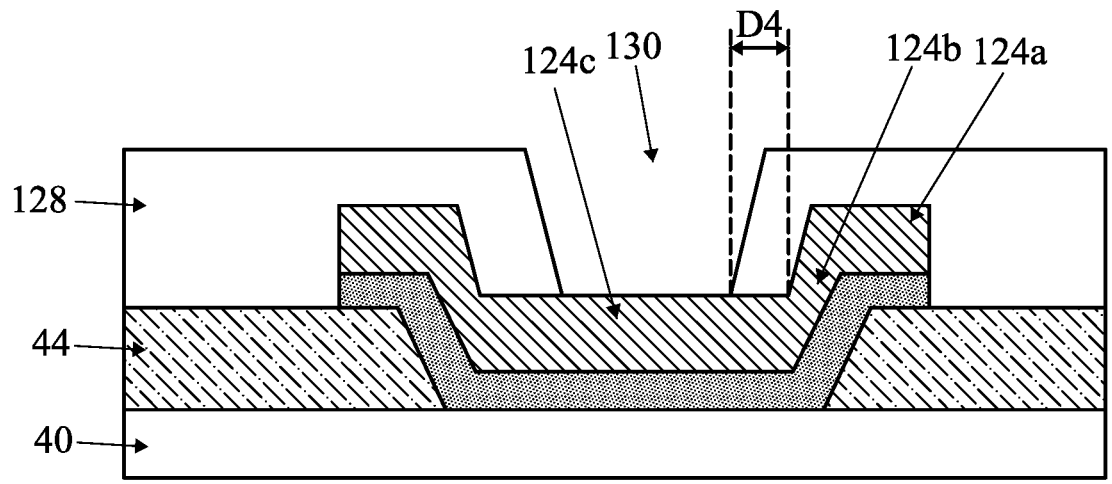
FIG. 26B is a more detailed portion of a cross-sectional view of an intermediate step during the process for forming the package structure in accordance with some embodiments.
Figure 26C:
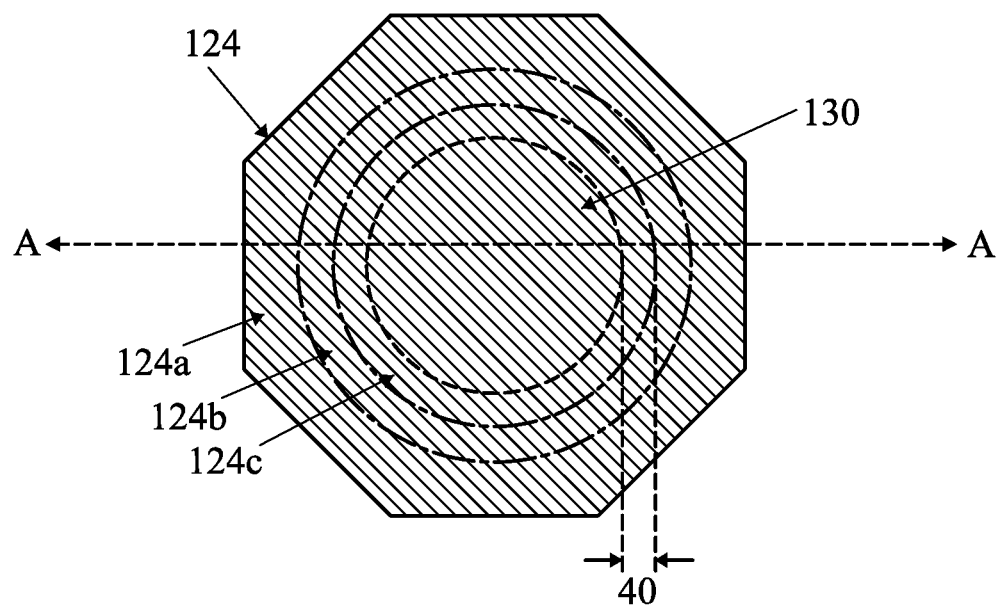
FIG. 26C is a layout view of a UBM and an opening through a dielectric layer in accordance with some embodiments.

FIG. 26B illustrates in further detail the cross sectional view of the UBM 124 and opening 130 through the third dielectric layer 128 in FIG. 26A, and FIG. 26C illustrates a layout view of the UBM 124 and opening 130 through the third dielectric layer 128. FIG. 26C illustrates a cross section A-A that is illustrated in FIGS. 26A and 26B. FIGS. 26B and 26C illustrate a first planar portion 124a, a sidewall portion 124b, and a second planar portion 124c of the UBM 124. The first planar portion 124a of the UBM 124 extends planarly on a top surface of the third dielectric layer 128. The sidewall portion 124b of the UBM 124 extends along sidewalls of the opening 46 of the second dielectric layer 44. The second planar portion 124c of the UBM 124 is in the opening 46 of the second dielectric layer 44 and extends planarly along a top surface of the first metallization pattern 40. The opening 130 through the third dielectric layer 128 exposes a portion of the second planar portion 124c. The third dielectric layer 128 covers the first planar portion 124a and the sidewall portion 124b. The third dielectric layer 128 extends from a joint between the sidewall portion 124b and the second planar portion 124c a dimension D4. In some embodiments, the dimension D4 is greater than or equal to about 10 μm.

Figure 27:
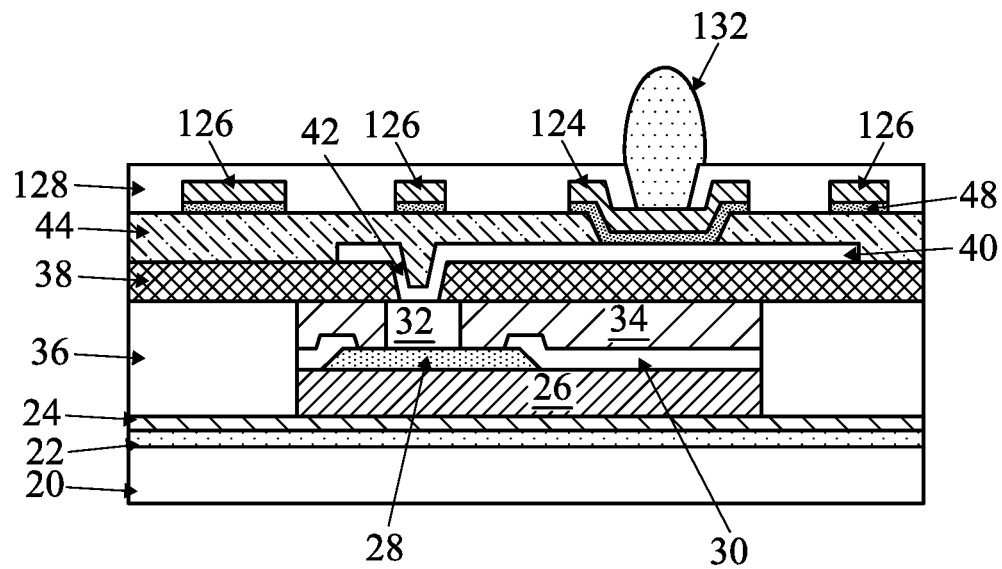

In FIG. 27, external electrical connectors 132 are formed on the UBMs 124 through the openings 130. In some embodiments, the external electrical connectors 132 can include low-temperature reflowable material, such as solder, such as a lead-free solder, formed on the UBMs 124 using an acceptable ball drop process. In some embodiments, the external electrical connectors 132 are BGA balls, C4 bumps, microbumps, or the like. In additional embodiments, the external electrical connectors 132 can include metal pillars.

Figure 28:
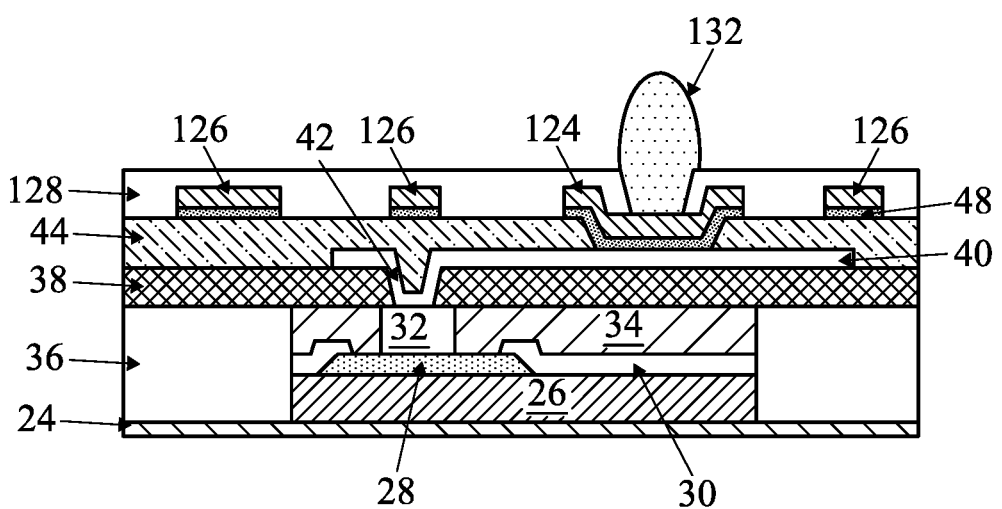

In FIG. 28, a carrier substrate de-bonding is performed to detach (de-bond) carrier substrate 20 from the package structure. In accordance with some embodiments, the de-bonding includes projecting a light such as a laser light or an UV light on release layer 22 so that release layer 22 decomposes under the heat of the light and carrier substrate 20 can be removed.

Although not depicted, the structure can then be flipped over and placed on a tape and singulated. One of ordinary skill in the art will understand that many such package structures may be simultaneously formed on the carrier substrate 20, and hence, individual packages, such as depicted in FIG. 28, can be singulated from the other packages, such as by sawing or dicing.

Figure 29:
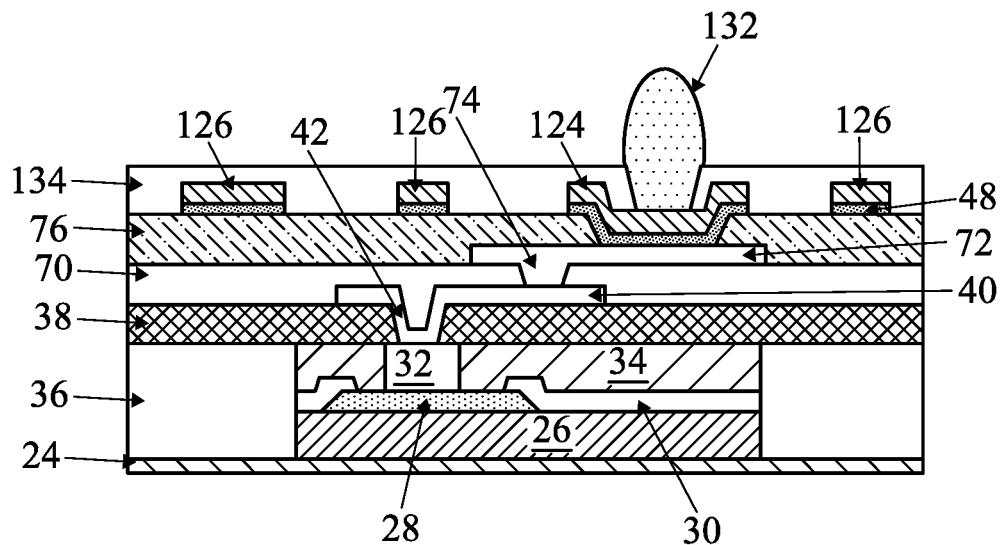
FIG. 29 is a cross-sectional view of a package structure in accordance with some embodiments.

FIG. 29 illustrates another cross-sectional view of a package structure in accordance with some embodiments. In the embodiment depicted in FIG. 29, the redistribution structure comprises an additional dielectric layer and metallization pattern. To form this package structure, a process may proceed through the steps discussed above with respect to FIGS. 1 through 3. Then, a second dielectric layer 70 can be formed on the first dielectric layer 38 and first metallization pattern 40. The second dielectric layer 70 can be a same or similar material and can be formed in a same or similar manner as described above with respect to the first dielectric layer 38. The second dielectric layer 70 is then patterned to form openings to expose portions of the first metallization pattern 40, such as in a same or similar manner as discussed above with respect to the first dielectric layer 38. A second metallization pattern 72 with vias 74 is formed on the second dielectric layer 70 and in the openings through the second dielectric layer 70, such as with a same or similar material and in a same or similar manner as described above with respect to the first metallization pattern 40 and vias 42. The vias 74 electrically couple the first metallization pattern 40 to the second metallization pattern 72. The process may then proceed as discussed above with respect to FIGS. 4, 5, and 24 through 28, where the second dielectric layer 44 and the third dielectric layer 128 correspond to a third dielectric layer 76 and a fourth dielectric layer 134, respectively, in FIG. 29.

Figure 30:
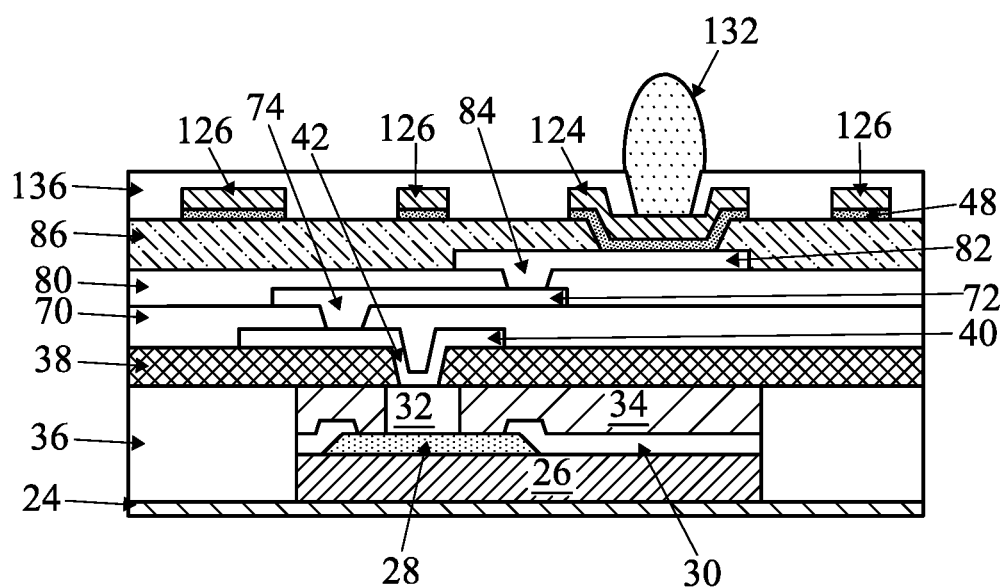
FIG. 30 is a cross-sectional view of a package structure in accordance with some embodiments.

FIG. 30 illustrates a further cross-sectional view of a package structure in accordance with some embodiments. In the embodiment depicted in FIG. 30, the redistribution structure comprises additional dielectric layers and metallization patterns. To form this package structure, a process may proceed through the steps discussed above with respect to FIGS. 1 through 3. Then, a second dielectric layer 70 can be formed on the first dielectric layer 38 and first metallization pattern 40. The second dielectric layer 70 can be a same or similar material and can be formed in a same or similar manner as described above with respect to the first dielectric layer 38. The second dielectric layer 70 is then patterned to form openings to expose portions of the first metallization pattern 40, such as in a same or similar manner as discussed above with respect to the first dielectric layer 38. A second metallization pattern 72 with vias 74 is formed on the second dielectric layer 70 and in the openings through the second dielectric layer 70, such as with a same or similar material and in a same or similar manner as described above with respect to the first metallization pattern 40 and vias 42. The vias 74 electrically couple the first metallization pattern 40 to the second metallization pattern 72.

Then, a third dielectric layer 80 can be formed on the second dielectric layer 70 and second metallization pattern 72. The third dielectric layer 80 can be a same or similar material and can be formed in a same or similar manner as described above with respect to the first dielectric layer 38. The third dielectric layer 80 is then patterned to form openings to expose portions of the second metallization pattern 72, such as in a same or similar manner as discussed above with respect to the first dielectric layer 38. A third metallization pattern 82 with vias 84 is formed on the third dielectric layer 80 and in the openings through the third dielectric layer 80, such as with a same or similar material and in a same or similar manner as described above with respect to the first metallization pattern 40 and vias 42. The vias 84 electrically couple the second metallization pattern 72 to the third metallization pattern 82. The process may then proceed as discussed above with respect to FIGS. 4, 5, and 24 through 28, where the second dielectric layer 44 and the third dielectric layer 128 correspond to a fourth dielectric layer 86 and a fifth dielectric layer 136, respectively, in FIG. 30.

Embodiments can achieve advantages. By forming an adhesion layer 60 on the UBMs 56 and upper metallization pattern 58, the third dielectric layer 62 may have increased adhesion to the UBMs 56 and upper metallization pattern 58, which may in turn reduce delamination of the third dielectric layer 62. Further, by having sloped sidewalls of the UBMs 56 and upper metallization pattern 58, more surface area may be available to which the third dielectric layer 62 may adhere, which may further reduce delamination. Also, the sloped sidewalls of the UBMs 56 may reduce a hump or other build-up of the third dielectric layer 62 on the UBMs 56, such as when the third dielectric layer 62 is PBO or another polymer layer. This may improve uniformity of the third dielectric layer 62, which may improve reliability of the package.

Further, by having an upper dielectric layer, such as the third dielectric layers 100 and 128, configured in some of the manners discussed above, delamination caused by flux penetration can be reduced. For example, by having an upper dielectric layer not contact a UBM, such as shown in FIG. 21, flux on the UBM from a ball or bump drop process may not come into contact with an interface of the upper dielectric layer with another component. If flux does not contact such an interface, delamination induced by flux penetrating the interface can be avoided. Also, by having an upper dielectric layer covering a larger area of the UBM, such as shown in FIG. 28, flux may have to penetrate the interface between the upper dielectric layer and the UBM further to cause any significant delamination of the upper dielectric layer. The further penetration distance can decrease the likelihood of penetration that results in significant delamination.

Although various embodiments have been discussed separately, one of ordinary skill in the art will readily understand that aspects of some embodiments may be applied to other embodiments. For example, the adhesion layer 60 may be applied to the upper metallization pattern and/or UBMs in the embodiments of FIGS. 21 and 28. Further, the sloped sidewalls of the upper metallization pattern and/or UBMs in the embodiment illustrated in FIG. 16 may be applied in the embodiments of FIGS. 21 and 28.

A first embodiment is a package structure. The package structure comprises an integrated circuit die, an encapsulant at least laterally encapsulating the integrated circuit die, a redistribution structure on the integrated circuit die and the encapsulant, a connector support metallization coupled to the redistribution structure, and an external connector on the connector support metallization. The redistribution structure comprises a first dielectric layer disposed distally from the encapsulant and the integrated circuit die. The connector support metallization has a first portion on a first surface of the first dielectric layer and has a second portion extending in an opening through the first dielectric layer. The first portion of the connector support metallization has a sloped sidewall extending in a direction away from the first surface of the first dielectric layer.

Another embodiment is a package structure. The package structure comprises a composite structure, a redistribution structure on the composite structure, and an under ball metallization (UBM) on the redistribution structure. The composite structure comprises an integrated circuit die and an encapsulating material at least laterally encapsulating the integrated circuit die. A first surface of the redistribution structure is distal from the composite structure. The UBM has a first portion on the first surface. A sidewall of the first portion forms a non-perpendicular angle with the first surface, and the non-perpendicular angle is measured internal to the UBM. An adhesion layer is on the first portion of the UBM. A first dielectric layer is on the redistribution structure and adjoins the adhesion layer. An external electrical connector is disposed through the first dielectric layer and on the UBM.

A further embodiment is a method. The method comprises encapsulating an integrated circuit die with an encapsulant and forming a redistribution structure on the integrated circuit die and the encapsulant. The redistribution structure comprises a metallization pattern and a first dielectric layer on the metallization pattern. The first dielectric layer has a first surface distal from the integrated circuit die and the encapsulant. The method further comprises forming an under ball metallization (UBM) on the redistribution structure. The UBM has a first portion on the first surface and a second portion disposed in an opening through the first dielectric layer to the metallization pattern. The first portion of the UBM has a sidewall surface that is non-perpendicular to the first surface of the first dielectric layer. The method further comprises forming a second dielectric layer on the first surface of the first dielectric layer and the first portion of the UBM and forming an external electrical connector through an opening through the second dielectric layer to the UBM.

Another embodiment is a package structure. The package structure comprises an integrated circuit die, an encapsulant at least laterally encapsulating the integrated circuit die, a redistribution structure on the integrated circuit die and the encapsulant, a connector support metallization coupled to the redistribution structure, a dummy pattern, a second dielectric layer, and an external connector on the connector support metallization. The redistribution structure comprises a first dielectric layer having a first surface disposed distally from the encapsulant and the integrated circuit die. The connector support metallization has a first portion on the first surface of the first dielectric layer and has a second portion extending in an opening through the first dielectric layer. The dummy pattern is on the first surface of the first dielectric layer and around the connector support metallization. The second dielectric layer is on the first surface of the first dielectric layer and on at least a portion of the dummy pattern. The second dielectric layer does not contact the connector support metallization.

An even further embodiment is a package structure. The package structure comprises an integrated circuit die, an encapsulant at least laterally encapsulating the integrated circuit die, a redistribution structure on the integrated circuit die and the encapsulant, a connector support metallization coupled to the redistribution structure, a second dielectric layer, and an external connector on the connector support metallization. The redistribution structure comprises a first dielectric layer disposed distally from the encapsulant and the integrated circuit die. The connector support metallization has a first portion on a first surface of the first dielectric layer, a second portion extending along a bottom surface of a first opening through the first dielectric layer, and a third portion extending along a sidewall of the first opening and between the first portion and the second portion. A joint is formed at a location where the second portion meets the third portion. The second dielectric layer is on the first surface of the first dielectric layer and on the first portion, the third portion, and at least a portion of the second portion of the connector support metallization. The external connector is through a second opening through the second dielectric layer.

A yet further embodiment is a method. The method comprises encapsulating an integrated circuit die with an encapsulant; forming a redistribution structure on the integrated circuit die and the encapsulant, the redistribution structure comprising a first dielectric layer having a first surface distal from the integrated circuit die and the encapsulant; forming an under ball metallization (UBM) and a dummy pattern on the redistribution structure, the dummy pattern surrounding the UBM on the first surface of the first dielectric layer; forming a second dielectric layer on the first surface of the first dielectric layer and at least a portion of the dummy pattern, wherein after the forming the second dielectric layer, the second dielectric layer does not contact the UBM; and forming an external electrical connector on the UBM.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    an integrated circuit die surrounded by an encapsulant;
    a redistribution structure over the integrated circuit die and the encapsulant, the redistribution structure comprising a first dielectric layer and a first metallization pattern over the first dielectric layer;
    an under ball metallization (UBM) and a dummy pattern over the redistribution structure, the UBM being electrically coupled to the first metallization pattern, the dummy pattern surrounding the UBM and being electrically isolated; and
    a second dielectric layer over the first dielectric layer and over at least a portion of the dummy pattern, the second dielectric layer being spaced apart from the UBM, the second dielectric layer covering an exterior portion of the dummy pattern laterally distal from the UBM and exposes an interior portion of the dummy pattern proximate to the UBM.

2. The device of claim 1, wherein the dummy pattern encircles the UBM in a top view.

3. The device of claim 2, wherein the dummy pattern has an annular ring shape in the top view.

4. The device of claim 3, wherein a width of the annular ring shape is between about 5 μm to about 10 μm.

5. The device of claim 3, wherein a distance between the dummy pattern and the UBM is larger than about 40 μm.

6. The device of claim 1, wherein the exterior portion of the dummy pattern comprises a first sidewall of the dummy pattern facing away from the UBM and comprises a perimeter region of an upper surface of the dummy pattern facing away from the redistribution structure.

7. The device of claim 6, wherein the interior portion of the dummy pattern comprises a second sidewall of the dummy pattern facing the UBM and comprises an inner region of the upper surface of the dummy pattern.

8. The device of claim 1, wherein the dummy pattern and the UBM comprise a same electrically conductive material.

9. The device of claim 1, further comprising an adhesion layer on at least the exterior portion of the dummy pattern.

10. The device of claim 9, wherein the adhesion layer comprises an oxide of a material of the dummy pattern.

11. The device of claim 1, further comprising a third dielectric layer between the redistribution structure and the second dielectric layer, wherein the UBM extends through the third dielectric layer to electrically couple to the first metallization pattern.

12. A device comprising:
a die embedded in an encapsulant;
a redistribution structure over the die and over the encapsulant, the redistribution structure having a first dielectric layer and a metallization pattern, the metallization pattern being electrically coupled to the die;
a second dielectric layer over the redistribution structure;
a connector support metallization over and extending into the second dielectric layer, the connector support metallization having a first portion along a first surface of the second dielectric layer distal from the encapsulant, a second portion along an upper surface of the metallization pattern, and a third portion between the first portion and the second portion; and
a third dielectric layer over the second dielectric layer, the third dielectric layer covering the first portion, the third portion, and perimeter regions of the second portion of the connector support metallization, wherein center regions of the second portion of the connector support metallization is exposed by the third dielectric layer.

13. The device of claim 12, further comprising an external connector over and electrically coupled to the connector support metallization.

14. The device of claim 12, wherein the metallization pattern extends along an upper surface of the first dielectric layer, wherein the second portion of the connector support metallization physically contacts the upper surface of the metallization pattern.

15. The device of claim 12, wherein the connector support metallization comprises a metal material, wherein the device further comprises an oxide layer between the connector support metallization and the third dielectric layer, wherein the oxide layer comprises an oxide of the metal material.

16. A device comprising:
a die;
a molding material around the die;
a redistribution structure over the die and the molding material;
a first isolation layer over the redistribution structure;
an under ball metallization (UBM) structure and a dummy pattern over the first isolation layer, wherein the dummy pattern surrounds the UBM structure and is electrically isolated, wherein the UBM structure is electrically coupled to a metallization pattern of the redistribution structure; and
a second isolation layer over the first isolation layer, wherein the second isolation layer is separated from the UBM structure, wherein the second isolation layer covers outer sidewalls of the dummy pattern facing away from the UBM structure, wherein inner sidewalls of the dummy pattern facing the UBM structure are exposed by the second isolation layer.

17. The device of claim 16, wherein the UBM structure extends through the first isolation layer to electrically couple to the metallization pattern.

18. The device of claim 16, wherein the dummy pattern has an upper surface distal from the die, wherein the second isolation layer covers at least half of a width of the upper surface of the dummy pattern.

19. The device of claim 16, wherein the UBM structure and the dummy pattern comprises a same metal material.

20. The device of claim 16, wherein in a top view, the dummy pattern is an annular ring encircling the UBM structure.

* * * * *